(12) United States Patent
Zimmermann et al.

(10) Patent No.: US 11,162,989 B2
(45) Date of Patent: Nov. 2, 2021

(54) MEASUREMENT DEVICE

(71) Applicant: Rohde & Schwarz GmbH & Co. KG, Munich (DE)

(72) Inventors: Dirk Zimmermann, Munich (DE); Franz Strasser, Munich (DE); Martin Wirnshofer, Munich (DE); Martin Welz, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/788,902

(22) Filed: Feb. 12, 2020

(65) Prior Publication Data

US 2021/0247428 A1 Aug. 12, 2021

(51) Int. Cl.
*G01R 31/26* (2020.01)
*G01R 27/02* (2006.01)
*G01R 27/04* (2006.01)

(52) U.S. Cl.
CPC ........... *G01R 27/025* (2013.01); *G01R 27/04* (2013.01)

(58) Field of Classification Search
CPC .......... G01R 31/26; G01R 31/2642; G01R 31/2648; G01R 31/2831; G01R 31/31702
See application file for complete search history.

(56) References Cited

U.S. PATENT DOCUMENTS

2018/0321300 A1* 11/2018 Borthwick ......... G01R 31/2642
2019/0271722 A1* 9/2019 Yamazaki ................ G01R 3/00

FOREIGN PATENT DOCUMENTS

GB 751727 A 7/1956

* cited by examiner

*Primary Examiner* — Tung X Nguyen
(74) *Attorney, Agent, or Firm* — Christensen O'Connor Johnson Kindness PLLC

(57) ABSTRACT

A measurement device with improved electrical strength comprises an input for receiving an input signal as well as a measurement circuit connected with the input. The measurement circuit has at least one component. The measurement device also comprises an electrical interface provided in addition to the input. The measurement device further comprises at least one internal enclosure that encloses the component within the measurement device, thereby improving the electrical strength of the measurement device.

19 Claims, 1 Drawing Sheet

MEASUREMENT DEVICE

FIELD OF THE DISCLOSURE

Embodiments of the present disclosure relate generally to a measurement device with improved electrical strength.

BACKGROUND

Modern measurement devices are typically used for different measurements to be performed on a device under test for characterizing the device under test entirely. This, however, results in different requirements concerning the electrical strength of the measurement devices in case that different types of signals are processed. Accordingly, the internal requirements of a measurement circuit used to measure the respective characteristics of the device under test are different.

For instance, high frequency applications require an impedance-controlled environment of the measurement circuit. Therefore, internal lines established between internal components of the measurement circuit shall be as short as possible, simplifying the establishment of the impedance-controlled environment. In contrast to these high frequency applications, high impedance measurements benefit from large distances between signal processing components and a mass, which contradicts the short internal lines.

Accordingly, these different measurement applications have different requirements on the internal structure of the measurement device, yielding different effects on the electrical strength.

It is further of particular importance that an initial electrical strength of the measurement device provided in its delivery state can be maintained even though the measurement device is used for many years. Accordingly, effects of aging and use shall not impair the electrical strength of the measurement device, particularly the initial one.

SUMMARY

Accordingly, there is a need for a measurement device that has improved electrical strength with respect to different measurement applications for a long period of time.

Embodiments of the present disclosure provide a measurement device with improved electrical strength. In an embodiment, the measurement device comprises an input for receiving an input signal as well as a measurement circuit connected with the input. The measurement circuit comprises at least one component. Further, the measurement device comprises an electrical interface provided in addition to the input. Moreover, the measurement device comprises at least one internal enclosure that encloses the component within the measurement device, thereby improving the electrical strength of the measurement device.

Accordingly, an internal enclosure is provided that is assigned to the component within the measurement device such that this specific component is encompassed or enclosed within the internal enclosure. In some embodiments, it is ensured that the component is not exposed to any environmental influences that might have an impact on the component itself. Therefore, it can be guaranteed that the component maintains its initial electrical strength over a certain period of time, as the component is not exposed to the environmental influences. In other words, the delivery state of the component, namely the one free of contamination, is preserved due to the internal enclosure.

The internal enclosure is provided around the at least one component under controlled environmental conditions, namely temperature, humidity and/or dirt. In some embodiments, these environmental conditions used when encompassing the component by the internal enclosure correspond to laboratory conditions.

In other words, the internal enclosure provides an inner space in which the environmental conditions are preserved that prevailed when the measurement device was manufactured, for example under laboratory conditions. Accordingly, the inner space is associated with laboratory conditions and, thus, the at least one component of the measurement circuit is exposed to the laboratory conditions. Put differently, the inner space maintains its delivery state and, therefore, the component of the measurement circuit does also.

Generally, this prevents the component of the measurement circuit from any aging effects due to environmental influences.

The at least one component of the measurement circuit corresponds to a processing component of the measurement circuit that is used for measuring the input signal received via the input.

The input may relate to a BNC connector, for example a BNC socket.

Generally, the internal enclosure encases the entire measurement circuit.

According to an aspect, the measurement device has an external housing that encompasses the internal enclosure. The external housing corresponds to the outer housing of the measurement device that can be touched by an operator of the measurement device. Since the external housing encompasses the internal enclosure, it is ensured that the operator of the measurement device cannot get in contact with the internal enclosure, as the internal enclosure is enclosed by the external housing. Even if the external housing is opened, which might generally be allowed, the component enclosed by the internal enclosure will not be exposed to any environmental influences due to the internal enclosure.

In some embodiments, the internal enclosure corresponds to an encapsulation that encapsulates the at least one component of the measurement circuit.

The internal enclosure may also be called wrapping, as the at least one component of the measurement circuit is wrapped by the internal enclosure so as to protect this component.

In other words, the component of the measurement circuit is permanently enclosed by the internal enclosure. The component can only be accessed by breaking the internal enclosure. Hence, the internal enclosure might not be opened in a non-destructive manner.

Another aspect provides that the internal enclosure provides an electromagnetic shielding. Thus, the component enclosed in the internal enclosure is protected against electromagnetic radiation that might have an impact on the component.

Moreover, the internal enclosure may be watertight and/or dust-tight. Therefore, water and/or dust cannot ingress into the inner space enclosed by the internal enclosure, in which the component is located.

In addition, the input may also be watertight and/or dust-tight. Thus, the input ensures that no water and/or dust may ingress the inner space provided by the internal enclosure via the input.

Further, the electrical interface may also be watertight and/or dust-tight. Accordingly, water and/or dust may also not ingress the inner space of the internal enclosure via the electrical interface.

The input and the electrical interface correspond to the only interfaces associated with the measurement circuit. Since they are also watertight and/or dust-tight, it is ensured that neither water nor dust may enter the inner space via the electrical interface and/or the input.

Therefore, an inner space of the internal enclosure may be hermetically sealed. Neither water nor dust can ingress the inner space provided by the internal enclosure, ensuring a protection of the component of the measurement circuit. Therefore, the component of the measurement circuit is protected against any environmental influences.

According to an embodiment, the internal enclosure comprises a sealing cord that provides an electromagnetic sealing, a water seal and/or a dust seal. Thus, the respective protection of the internal enclosure may be provided by the sealing cord. Furthermore, the sealing cord may improve an already existing sealing function of a portion of the internal enclosure.

In some embodiments, the sealing cord is disposed circumferentially around a rim of the internal enclosure. This ensures that no water, no dust and no electromagnetic signals may harm the component provided in the internal enclosure, for example via any interfaces provided.

The at least one component may be a printed circuit board. Thus, the measurement circuit may comprise a printed circuit board that is used to process the at least one signal received via the input. The printed circuit board may be enclosed by the internal enclosure such that the printed circuit board is protected against environmental influences.

In some embodiments, the printed circuit board comprises a multilayer structure. Thus, inner layers of the printed circuit board are protected by outer layers of the multilayer structure.

For instance, the electrical interface is buried in an inner layer of the multilayer structure. Therefore, the electrical interface is protected against environmental influences in an improved manner. In addition, short circuits with the sealing cord are prevented accordingly.

The printed circuit board may carry further components of the measurement circuit. The further components may correspond to components used for processing the signal received via the input.

In general, the electrical interface may relate to any kind of (electrical) feedthrough.

The electrical interface may correspond to a power supply for receiving power, a control signal input for receiving a control signal and/or an output for outputting an output signal. Thus, the electrical interface provided additionally to the input may have different functions used by the measurement device, for example the measurement circuit. For instance, the control signal input may be used to control the measurement circuit in an intended manner such that intended measurements are performed by the measurement circuit. A processed signal, namely a signal outputted by the measurement circuit, can be outputted via the output, for instance for further processing. Hence, the processed signal corresponds to the output signal. The output signal may be forwarded to a post-processing component, for example a display in order to display the output signal. The measurement circuit may receive the required power via the power supply.

According to an embodiment, the measurement device is an oscilloscope. The oscilloscope may provide different measurement functions, for instance a high-impedance measurement as well as a high frequency measurement. Typically, the oscilloscope has a single input connected with two different measurement paths.

The oscilloscope may be assigned to a high-impedance measurement path (in the range of Mega Ohm such as 1 MOhm) and a high-frequency measurement path associated with a resistance of 50 Ohm.

Another aspect provides that the input and the measurement circuit connected thereto are configured to provide at least two different measurement paths for different measurements. The at least two different measurement paths are connected with the single input. The measurement circuit provides two different measurement paths that share the single input. Thus, different signals may be inputted via the single input, wherein the respective signal is forwarded to the measurement circuit for further processing. Depending on the type of signal received and/or setting provided, a certain measurement path of the at least two different measurement paths is used to perform the respective measurement on the input signal.

Further, the at least two different measurement paths share the at least one component of the measurement circuit. Thus, the at least one component is part of both measurement paths such that it is necessary to protect this specific component in an improved manner. In some embodiments, this specific component used by both measurement paths has to fulfill the requirements of both measurement functions associated with the respective measurement paths. This is ensured by the internal enclosure enclosing that specific component.

According to another aspect, a first measurement path and a second measurement path relate to a high-impedance measurement path and an impedance-controlled measurement path. These different measurement paths are used for high frequency applications and high-impedance measurements at higher voltages.

The internal enclosure ensures that the electrical strength, also called dialectical strength, used for high-frequency measurements, namely the measurements performed by the impedance-controlled measurement path, is sufficiently high for high-impedance measurements performed by the high-impedance measurement path since the measurement circuit, for example the shared component(s) of the measurement circuit are protected against environmental influences. This ensures that the shared component(s) are maintained in their clean conditions associated with the delivery state of the measurement device.

In some embodiments, the impedance-controlled measurement path regulates the distances of respective components, which in turn results in maximum input voltages that are limited due to the electrical strength of the measurement device. Since the electrical strength can be improved by hermetically sealing the components of the measurement circuit used for impedance-controlled measurements, namely high frequency measurements, and high voltage measurements, namely high impedance measurements, the measurement device can process higher maximum input voltages.

The internal enclosure guarantees that dirt and/or water never ingresses the inner space of the internal enclosure in which the shared component(s) of the measurement circuit are located.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
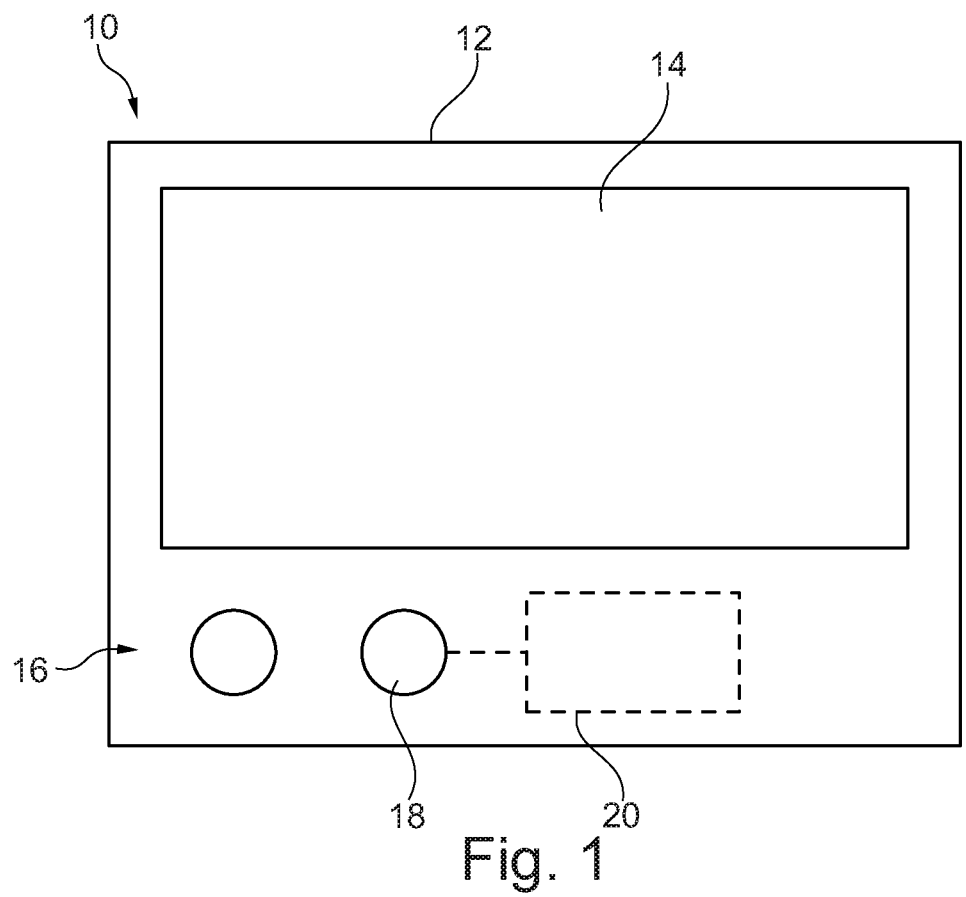
FIG. 1 shows a schematic overview of a representative measurement device according to the present disclosure.

In FIG. 1, a measurement device 10 is shown that comprises an external housing 12, a display 14 and a frontend 16. Further, the measurement device 10 has at least one input 18 at the frontend 16, which is configured to receive an input signal that is processed internally by the measurement device 10. For instance, the input 18 is established by a BNC connector.

The input 18 is connected with a measurement circuit 20 that is internally disposed within the external housing 12. Thus, the measurement circuit 20 is shown by dashed lines in FIG. 1.

Figure 2:
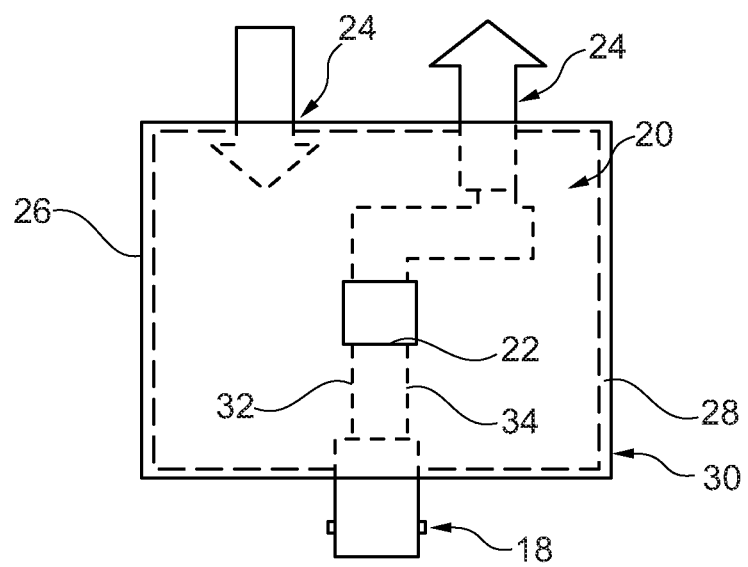
FIG. 2 shows a schematic overview of a detail of the measurement device of FIG. 1.

In FIG. 2, the internal components of the measurement device 10, for example the measurement circuit 20, are illustrated in more detail.

The measurement circuit 20 comprises at least one component 22 that is used to process the input signal received via the input 18. In general, the component 22 may relate to a printed circuit board (PCB) providing the measurement equipment for performing respective measurements on the input signal received. Accordingly, further components of the measurement circuit 20 may be provided on the printed circuit board, which are used for processing the input signal.

In addition, the measurement device 10 comprises at least one electrical interface 24 that is provided in addition to the input 18.

In the shown embodiment of FIG. 2, different electrical interfaces 24 are shown that correspond to a power supply for receiving power, a control signal input for receiving a control signal and an output for outputting an output signal that corresponds to the processed signal of the measurement circuit 20.

The measurement device 10 also comprises at least one internal enclosure 26 that encloses the measurement circuit 20 as well as the at least one component 22 of the measurement circuit 20.

The internal enclosure 26 improves the electrical strength of the measurement device 10, as the measurement circuit 20, for example the at least one component 22, enclosed within the internal enclosure 26 is protected against environmental influences.

For instance, the internal enclosure 26 is watertight and dust-tight while further providing an electromagnetic shielding. Therefore, the measurement circuit 20, for example the at least one component 22, is protected against those environmental influences.

In addition, the input 18 as well as the electrical interface 24 are also established in a watertight and/or dust-tight manner, ensuring that no water and/or no dust may enter an inner space provided by the internal enclosure 26, which accommodates the measurement circuit 20.

Accordingly, the inner space of the internal enclosure 26 is hermetically sealed against the environment, thus preserving the initial conditions when the internal enclosure 26 encloses the measurement circuit 20 during the manufacturing process. Accordingly, the internal conditions provided within the internal enclosure 26 correspond to laboratory conditions that can be persevered appropriately.

In the shown embodiment of FIG. 2, the internal enclosure 26 comprises a sealing cord 28 that is disposed circumferentially around a rim 30 of the internal enclosure 26. Hence, the respective hermetically sealing of the internal enclosure 26 is provided or at least improved by means of the sealing cord 28.

Generally, the measurement circuit 20 provides two different measurement paths 32, 34 for different measurements to be performed on the input signal received via the input 18. The different measurement paths 32, 34 are illustrated by dashed lines.

As shown in FIG. 2, both measurement paths 32, 34 are connected with the single input 18 such that the input signal is processed by the first measurement path 32 or the second measurement path 34 depending on the kind of measurement to be performed.

This might be set by the electrical interface 24, namely the control signal input.

The at least two different measurement paths 32, 34 share the at least one component 22 of the measurement circuit 20 that is encompassed by the internal enclosure 26, as this specific component 22 has to be protected against environmental influences.

For instance, the first measurement path 32 relates to a high-impedance measurement path that is used for high-impedance measurements at high voltages, whereas the second measurement path 34 relates to an impedance-controlled measurement path that is used for high frequency measurements.

In general, the printed circuit board may have a multilayer structure, wherein the at least one electrical interface 24 is buried in an inner layer of the multilayer structure. Hence, the electrical interface 24 is protected by an outer layer of the multilayer structured printed circuit board.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement device with improved electrical strength, said measurement device comprising:
   an input for receiving an input signal;
   a measurement circuit connected with said input, said measurement circuit comprising at least one component;
   an electrical interface provided in addition to said input; and
   at least one internal enclosure that encloses said component within said measurement device, thereby improving the electrical strength of said measurement device,
   wherein said input and said measurement circuit connected thereto are configured to provide at least two different measurement paths for different measurements, said at least two different measurement paths are connected with said single input.

2. The measurement device according to claim 1, wherein said measurement device has an external housing that encompasses said internal enclosure.

3. The measurement device according to claim 1, wherein said internal enclosure provides an electromagnetic shielding.

4. The measurement device according to claim 1, wherein said internal enclosure is at least one of watertight and dust-tight.

5. The measurement device according to claim 1, wherein said input is at least one of watertight and dust-tight.

6. The measurement device according to claim 1, wherein said electrical interface is at least one of watertight and dust-tight.

7. The measurement device according to claim 1, wherein an inner space of said internal enclosure is hermetically sealed.

8. The measurement device according to claim 1, wherein said internal enclosure comprises a sealing cord that provides at least one of an electromagnetic shielding, a water seal and a dust seal.

9. The measurement device according to claim 8, wherein said sealing cord is disposed circumferentially around a rim of said internal enclosure.

10. The measurement device according to claim 1, wherein said at least one component is a printed circuit board.

11. The measurement device according to claim 10, wherein said printed circuit board comprises a multilayer structure.

12. The measurement device according to claim 11, wherein said electrical interface is buried in an inner layer of said multilayer structure.

13. The measurement device according to claim 10, wherein said printed circuit board carries further components of said measurement circuit.

14. The measurement device according to claim 1, wherein said electrical interface corresponds to at least one of a power supply for receiving power, a control signal input for receiving a control signal and an output for outputting an output signal.

15. The measurement device according to claim 1, wherein said measurement device is an oscilloscope.

16. The measurement device according to claim 1, wherein said at least two different measurement paths share said at least one component of said measurement circuit.

17. The measurement device according to claim 1, wherein a first measurement path and a second measurement path relate to a high-impedance measurement path and an impedance-controlled measurement path.

18. A measurement device with improved electrical strength, said measurement device comprising:
   an input for receiving an input signal;
   a measurement circuit connected with said input, said measurement circuit comprising at least one component;
   an electrical interface provided in addition to said input; and
   at least one internal enclosure that encloses said component within said measurement device, thereby improving the electrical strength of said measurement device,
   wherein said internal enclosure comprises a sealing cord that provides at least one of an electromagnetic shielding, a water seal and a dust seal, and
   wherein said sealing cord is disposed circumferentially around a rim of said internal enclosure.

19. A measurement device with improved electrical strength, said measurement device comprising:
   an input for receiving an input signal;
   a measurement circuit connected with said input, said measurement circuit comprising at least one component;
   an electrical interface provided in addition to said input; and
   at least one internal enclosure that encloses said component within said measurement device, thereby improving the electrical strength of said measurement device,
   wherein said measurement device has an external housing that encompasses said internal enclosure that is enclosed by said external housing, and
   wherein said internal enclosure corresponds to an encapsulation that encapsulates said component of said measurement circuit such that a delivery state of said component is preserved due to said internal enclosure.

* * * * *